United States Patent [19]

Neubauer

[11] 4,337,307

[45] Jun. 29, 1982

[54] LIGHT-SENSITIVE DIAZO COMPOSITION AND MATERIAL WITH BRANCHED POLYURETHANE RESIN

[75] Inventor: Rudolf Neubauer, Erbach, Fed. Rep. of Germany

[73] Assignee: Hoechst Aktiengesellschaft, Fed. Rep. of Germany

[21] Appl. No.: 211,399

[22] Filed: Nov. 28, 1980

[30] Foreign Application Priority Data

Dec. 3, 1979 [DE] Fed. Rep. of Germany ....... 2948554

[51] Int. Cl.³ .......................... G03C 1/60; G03F 7/08
[52] U.S. Cl. .................................. 430/157; 430/175; 430/176; 430/302; 430/325; 430/906
[58] Field of Search ............... 430/175, 176, 192, 284, 430/906, 919, 157, 302, 325

[56] References Cited

U.S. PATENT DOCUMENTS

| | | | |
|---|---|---|---|
| 3,660,099 | 5/1972 | Maimthia | 430/175 |
| 3,840,390 | 10/1974 | Kozu et al. | 430/287 |
| 3,850,770 | 11/1974 | Juna et al. | 430/284 |
| 4,139,506 | 2/1979 | Thoese et al. | 430/176 |
| 4,186,017 | 1/1980 | Palmer | 430/175 |

FOREIGN PATENT DOCUMENTS 1463818 2/1977 United Kingdom ............... 430/175

Primary Examiner—Charles L. Bowers, Jr.
Attorney, Agent, or Firm—James E. Bryan

[57] ABSTRACT

A light-sensitive composition for the preparation of printing plates and photoresists is described, which comprises as the light-sensitive compound a diazonium salt polycondensation product and as the binding agent a branched polyurethane resin which contains no terminal isocyanate groups and the terminal units of which are at least partially derived from dihydroxy compounds. The printing plates produced with this light-sensitive composition are easily developable with aqueous developer solutions and yield long press runs.

9 Claims, No Drawings

LIGHT-SENSITIVE DIAZO COMPOSITION AND MATERIAL WITH BRANCHED POLYURETHANE RESIN

The present invention relates to a negative-acting light-sensitive composition which contains a diazonium salt polycondensation product as the light-sensitive compound and a polyurethane resin as the binding agent, and which is preferably used for the preparation of printing plates.

U.S. Pat. No. 3,660,097, describes compositions of the above-mentioned kind, which comprise linear polyurethane resins in a combination with negative-acting or positive-acting diazonium compounds. These compositions and the light-sensitive copying materials prepared therewith have certain disadvantages: They have a relatively poor solubility in conventional coating solvents, such as glycol monoethers; the solution must be filtered several times to remove residues; the layers can be developed with difficulty only; and the number of impressions achievable is limited.

German Offenlegungsschrift No. 2,739,774, discloses corresponding compositions and copying materials which contain polyurethanes with terminal NCO groups in combination with an acid as a stabilizer. These materials have a considerably improved solubility and yield higher press runs on printing. Their developability is also improved, however, it is not yet optimal.

Accordingly, it is an object of the present invention to provide light-sensitive compositions of the kind specified which, as compared with the hitherto known compositions, can be more easily and more safely developed with ecologically acceptable developers.

The invention, therefore, provides light-sensitive compositions which comprise, as the light-sensitive compound, a diazonium salt polycondensation product and, as the binding agent, a polyurethane resin which does not contain any terminal isocyanate groups.

The compositions according to the invention have the feature that the polyurethane resins are branched polyurethanes, the terminal units of which are at least partially derived from dihydroxy compounds.

The branched polyurethanes contained in the compositions of the invention are polyaddition products from compounds which have at least two isocyanate groups and compounds which have at least two active hydrogen atoms capable of reacting with isocyanate groups. At least some of the compounds with active hydrogen atoms are dihydroxy compounds. The reactants are employed in such quantities that all isocyanate groups are caused to react. All terminal groups therefore comprise active hydrogen atoms, and at least part of the terminal units have one free hydroxy group each.

By using an appropriate portion of at least trifunctional compounds, branching points in desired numbers are introduced into the polymer molecule. Trifunctional compounds are preferred for this purpose, in particular trihydric alcohols.

Hydroxy compounds, particularly aliphatic diols and triols, are generally preferred as the compounds with active hydrogen atoms.

Suitable diisocyanates are, for example: 2,4-tolylene-diisocyanate; 2,6-tolylene-diisocyanate; 4,4'-diphenylmethane-diisocyanate; isophorone-diisocyanate; 2,2,4-trimethyl-hexamethylene-diisocyanate; hexamethylene-diisocyanate; xylylene-diisocyanate; 3,3'-bitolylene-4,4'-diisocyanate; 3,3'-dimethyl-cyclohexane-4,4'-diisocyanate; benzylcyclohexane-4,4'-diisocyanate; 4,4'-diphenylether-diisocyanate; naphthalene-diisocyanate; and lysine-diisocyanate.

Of these, 2,4-tolylene-diisocyanate; 2,6-tolylene-diisocyanate; 4,4'-diphenylmethane-diisocyanate; and 2,2,4-trimethylhexamethylene-diisocyanate are preferred.

The diisocyanates may be used individually or in admixture with one another.

Part of the quantity of diisocyanate also may be replaced by at least trifunctional polyisocyanates, for example, by triphenylmethane-4,4',4''-triisocyanate, by a triisocyanate which contains biuret groups and is prepared from 1 mole of water and 3 moles of hexamethylene-diisocyanate, and by mixtures of these compounds.

As the trihydric alcohols, 1,1,1-trimethylol-methane; 1,1,1-trimethylol-ethane; 1,1,1-trimethylol-propane; glycerol; triethanolamine; tris-hydroxyethyl-isocyanurate and trishydroxyethyl-phloroglucinol, for example, may be employed.

Preferred are the 1,1,1-trimethylol-alkanes.

Suitable divalent hydroxy compounds are, for example, polyalkylene glycols of the general formula

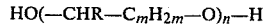
$$HO(-CHR-C_mH_{2m}-O)_n-H$$

wherein
R denotes H or alkyl, preferably H or methyl,
m is an integer ranging from 1 to 10, and
n is an integer ranging from 2 to 10.

Polyester diols and polybutadiene diols also may be used.

In addition, it is possible to use diols which contain aromatic rings or hetero-atoms and which have, for example, the following general formulae:

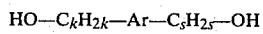
$$HO-C_kH_{2k}-Ar-C_sH_{2s}-OH$$

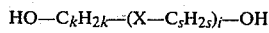
$$HO-C_kH_{2k}-(X-C_sH_{2s})_i-OH$$

$$HO-C_kH_{2k}-N\diagup\diagdown N-C_sH_{2s}-OH$$
(with H bridging)

wherein
Ar is an arylene group, preferably a phenylene group,
X may be NH, S or O, and
k and s are integers ranging from 1 to 6,
or, for example, 2,2-bis(4-β-hydroxyethoxy-phenyl)-propane or hydroxy-pivalic acid neopentyl glycol ester. Aliphatic diols are preferred.

Furthermore, part of the diol or triol may be replaced by compounds which comprise at least two active hydrogen atoms and have the general formula

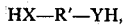
$$HX-R'-YH,$$

wherein
X and Y are identical or different and represent O, NR'' or S,
R' is an aliphatic, aromatic, mixed aliphatic-aromatic or heterocyclic group and
R'' is H, an alkyl group or a group R'—XH.
R' may, for example, be phenylene, pyridylene, $C_nH_{2n}$, $C_nH_{2n}$-phenylene or $C_nH_{2n}$-phenylene-$C_nH_{2n}$.

Suitable compounds of the formula HX—R'—YH are, for example, ethylene diamine, thioglycol, diethanolamine, butanolamine, diethylene triamine and m-aminophenol.

Of two different or non-symmetrical groups which are capable of reacting with isocyanates, one group generally reacts more readily under the reaction conditions.

It is also possible to use compounds which have only one grouping capable of reacting with isocyanates under the reaction conditions, but which may contain further functional groups. Compounds of this kind are, for example, 2-amino-pyridine, N,N-dimethyl-ethanolamine, N-ethyl-N-(2-hydroxyethyl)-aniline and N,N-diethyl-m-aminophenol. These compounds constitute in each case a smaller quantitative portion only of all compounds with active hydrogen atoms.

The quantitative ratios between trifunctional and difunctional compounds and the stoichiometric excess of compounds with active hydrogen atoms are chosen in each case according to the desired degree of branching and the desired molecular weight. These parameters determine the properties, in particular, the developability of the light-sensitive layers prepared with these binding agents, i.e. the solubility or emulsifiability of the binding agent in the developer used. If hydroxy compounds only are used as the compounds with active hydrogen atoms, the ratio diol: triol ranges usually from 0.1 to 9, preferably from 1 to 4 moles of a diol for each mole of a triol.

The molar ratio of isocyanate compound: compound with active hydrogen atoms determines the molecular weight to be expected. It is adjusted in such a way that the resulting molecular weights as not too high, because excessive molecular weights would have an adverse affect upon the developability of the layer. The molecular weight distribution which may be determined by way of gel permeation chromatography should not include any appreciable portions in excess of 200,000.

The mean molecular weights of the branched polyurethanes may vary within wide limits, depending upon the degree of branching and the nature of their constituents. In general, products are suitable, wherein the most frequent molecular weights (maxima of the molecular weight distribution curves) range between 3,000 and 30,000. Products having values between 5,000 and 20,000 are preferred.

The degree of branching of the polymer molecules should generally be such that there is one branching point for every 650 to 10,000, preferably for every 750 to 5,000, molecular weight units. The lower values within these ranges are to be assigned to polymers having lower mean molecular weights and vice versa.

The branched polyurethanes are prepared in known manner by reacting isocyanate compounds at an elevated temperature with compounds having active hydrogen atoms, particularly hydroxy compounds, in an inert solvent, appropriately in the presence of a catalyst, for example, a tertiary amine. In the process, all reactants may be reacted simultaneously (one-pot process). It is, however, also possible to produce, in a first step, a branched prepolymer which contains terminal isocyanate groups and the terminal groups of which are then reacted with an excess of a compound with active hydrogen atoms, at least part of which comprises a diol.

Suitable diazonium salt polycondensation products are condensation products of aromatic diazonium salts which are capable of condensation, e.g. of diphenylamine-4-diazonium salts, with aldehydes, preferably formaldehyde. It is especially advantageous to use mixed condensation products which, in addition to recurring diazonium salt units $A—N_2X$, contain other recurring units B which are not light-sensitive and which are derived from compounds which are capable of condensation, in particular from aromatic amines, phenols, phenol ethers, aromatic thioethers, aromatic hydrocarbons, aromatic heterocycles and organic acid amides. The units are connected by intermediate members, preferably methylene groups, which are derived from carbonyl compounds capable of condensation in a strong acid medium, preferably from formaldehyde. Condensation products of this kind are described in German Offenlegungsschrift No. 2,024,244. In general, all of the diazonium salt polycondensation products disclosed in German Offenlegungsschrift No. 2,739,774, are suitable.

The diazonium salt units are preferably derived from compounds having the formula $(R^1—R^3—)_pR^2—N_2X$, wherein X is the anion of the diazonium compound, p is an integer from 1 to 3, $R^1$ is an aromatic group with at least one position which is capable of condensation with an active carbonyl group, $R^2$ is a phenylene group, and $R^3$ is a single bond or one of the following groups:

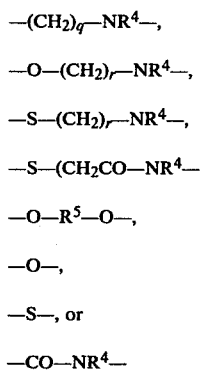

—(CH$_2$)$_q$—NR$^4$—,

—O—(CH$_2$)$_r$—NR$^4$—,

—S—(CH$_2$)$_r$—NR$^4$—,

—S—(CH$_2$CO—NR$^4$—,

—O—R$^5$—O—,

—O—,

—S—, or

—CO—NR$^4$— wherein q denotes an integer ranging from 0 to 5, r is an integer ranging from 2 to 5, $R^4$ is hydrogen, an alkyl group having from 1 to 5 carbon atoms, an aralkyl group having from 7 to 12 carbon atoms, or an aryl group having from 6 to 12 carbon atoms and $R^5$ is an arylene group having from 6 to 12 carbon atoms.

The compositions of the invention usually contain the following quantities of the diazonium salt polycondensation product and of the branched polyurethane: from 10 to 90, preferably from 10 to 70 percent by weight of diazonium compound and from 90 to 10, preferably from 90 to 30 percent by weight of polyurethane.

In order to stabilize the light-sensitive composition, it is advantageous to add a compound of an acid character to the composition. For that purpose, mineral acids and strong organic acids may be used, of which phosphoric acid, sulfuric acid, perchloric acid, boric acid or p-toluene sulfonic acid are preferred. Phosphoric acid is particularly suitable.

Furthermore, conventional plasticizers, adhesion promoters, dyes, pigments, color precursors and other resins may be added to the compositions.

The types and quantities of these additions depend upon the fields of application for which the compositions of the invention are intended. In principle, care must be taken that the added substances do not absorb an excessive portion of the actinic light which is required for cross-linking and thus cause a reduction of the practical sensitivity to light.

The light-sensitive compositions also may contain dyes and/or pigments, which may act as contrast media and also may serve to harden the layer. Suitable dyes are, for example, specified in U.S. Pat. Nos. 3,218,167 and 3,884,693.

Particularly suitable dyes are, for example, Victoria Pure Blue FGA or Zapon Fast Fire Red B (C.I. 13900:1).

To increase the image contrast after exposure, metanil yellow (C.I. 13065) and methyl orange (C.I. 13025) may be used.

Within the scope of the present invention, the following percentages by weight of the most important constituents in the light-sensitive composition are preferred. The percentages given relate to the contents of non-volatile constituents, i.e. the constituents of the compact light-sensitive layer obtained after the evaporation of the solvent:

| | |
|---|---|
| Polyurethane | from 30 to 90% |
| Diazonium salt poly-condensation product | from 10 to 70% |
| Acid | from 0 to 5% |
| Dye or pigment | from 0 to 5% |
| Dye producing contrast upon exposure | from 0 to 5% |

The light-sensitive compositions according to the invention may be industrially utilized in the form of a solution or dispersion, e.g. as a so-called "photoresist composition" which is applied by the user to an individual support, for example, as used for chemical milling, for the manufacture of printed circuits or stencils, nameplates, screen printing forms and the like. After drying, the layer so prepared can be imagewise exposed and developed. In this case, the constituents of the light-sensitive composition are dissolved in a suitable solvent. The solvents which may be employed are, for example, alcohols, ketones, esters and ethers, etc. The partial ethers of glycols or of ketoalcohols, for example, ethylene glycol monomethyl ether, have proved to be favorable solvents for this purpose.

In particular, it is also possible to market the light-sensitive composition of the invention in the form of a compact light-sensitive layer which has been already applied to a support material and is used for the manufacture of printing forms, relief images, etch resists, stencils, matrices, screen printing forms, individual copies and the like. A particularly important field of application is the preparation of storable presensitized lithographic printing plates.

The coating is applied to the support material from appropriate organic solvents or solvent mixtures, by slot-die coating, spraying or immersing.

Suitable layer supports are, for example, magnesium, zinc, copper, mechanically, chemically or electrochemically roughened aluminum, anodized aluminum and steel, but also polyester or acetate film, perlon gauze etc., the surfaces of which may have been subjected to a pretreatment, if required. The support material may serve as a final coating support or as an intermediate support material, from which the light-sensitive layer is transferred by lamination to the workpiece to be processed.

The recording materials prepared with the light-sensitive compositions serve, on the one hand, for the production of images on suitable supports or receiving sheets and, on the other hand, for the production of reliefs which are used as printing forms, screens, resists and the like.

In addition, it is also possible to use the light-sensitive compositions for the preparation of lacquers which can be hardened by ultraviolet radiation and may be used for the protection of surfaces or for the formulation of UV-hardenable printing inks.

The compositions are particularly advantageously used for the manufacture of lithographic printing forms and, in that case, aluminum is the preferred support material.

It is especially preferred to use aluminum which has been pretreated in the usual way, for example, by a mechanical, chemical or electrochemical roughening treatment and, if appropriate, an ensuing anodic oxidation. A further treatment of this support material is advantageous, for example, with polyvinyl phosphonic acid, alkali silicate, phosphate, hexafluorozirconate, chromate, borate, polyacrylamide and cellulose derivatives.

The copying materials obtained by means of the compositions of the invention are processed in the manner known in the art, by imagewise exposing and washing out the unexposed layer areas with a suitable developer. The preferred developers are aqueous solutions which contain at least 80 percent by weight of water. Suitable developer solutions are, for example, described in German Offenlegungsschrift Nos. 2,809,774 and 2,941,960.

By means of the present invention the disclosure of U.S. Pat. No. 3,660,097, that only linear thermoplastic polyurethanes are suitable as binding agents in the light-sensitive layers of printing plates is negated.

It is surprising that compositions of the type proposed by the invention, which contain branched polyurethanes, are not only readily soluble in the solvents which are suitable for coating, but are also developable with ecologically acceptable aqueous developers and are thus superior to the linear polyurethanes described in U.S. Pat. No. 3,660,097.

After development, the materials may be directly used, for example, as lithographic printing forms. It is also possible to subject them in known manner to a heat-treatment of some minutes at a temperature ranging from about 200° to 240° C., in order to obtain a longer press life.

The layers which contain branched polyurethanes have the following advantages:

High practical sensitivity to light, capability of sharp differentiation between image and non-image areas, high resolving power, easy scum-free development, long press runs on printing presses, good compatibility of the layer constituents in the solvents which are suitable for coating, for example, ethylene glycol monomethyl ether, ethylene glycol monoethyl ether, diacetone alcohol and mixtures of the solvents mentioned with butyl acetate, ethylene glycol methylether acetate and methyl isobutyl ketone.

The examples which follow are intended to explain the invention in more detail. Parts by weight and parts by volume have the same relationship as the g to the ml; percentages and weight ratios denote units by weight, unless otherwise specified.

EXAMPLE 1

A mixture composed of 91.5 g (0.125 mole) of a prepolymer prepared from tolylene-diisocyanate and 1,1,1-trimethylol propane in a molar ratio of 3:1, 36.2 g (0.306 mole) of hexanediol-1,6 and 0.1 g of 1,4-diazabicyclo(2,2,2)-octane in 650 ml of tetrahydrofuran was refluxed for 10 hours.

After cooling, the solution had a viscosity of 0.291 cm$^2$/s at 25° C. The solution was introduced into 5 liters of water and the white granular product obtained was filtered and dried. The yield amounted to 120 g of polymer having a softening point of about 110° C.

A coating solution was prepared from:
- 30.0 p.b.w. of the above-described binding agent,
- 15.6 p.b.w. of a diazonium salt polycondensation product, prepared from paraformaldehyde and diphenylamine-4-diazonium chloride in an 85% concentration phosphoric acid,
- 15.0 p.b.w. of a pigment dispersion, composed of 10% of β-copper phthalocyanine pigment (C.I. 74160), 10% of polyvinylformal and 80% of acetic acid-2-methoxyethyl ester,
- 0.4 p.b.w. of metanil yellow (C.I. 13065), and
- 1.0 p.b.w. of phosphoric acid (85%) in
- 940.0 p.b.w. of ethylene glycol monomethyl ether.

The solution was applied to an aluminum sheet which had been roughened by brushing with an aqueous abrasive suspension and then pretreated with an aqueous solution of polyvinyl phosphonic acid.

The copying layer was exposed to light for 30 seconds under a negative original, using a 5 kW metal halide lamp.

Then the exposed layer was treated with a developing solution of the following composition:
- 5.0 p.b.w. of benzyl alcohol,
- 5.0 p.b.w. of a copolymer of N-methyl-N-vinyl acetamide and dioctylmaleinate (88:12),
- 3.0 p.b.w. of Na-octyl sulfate, and
- 4.0 p.b.w. of phosphoric acid (85%), using a plush pad so that the non-image areas were removed. It was then rinsed with water and wiped over with a wiper blade. In the copy obtained, step 5 of a silver film continuous tone step wedge was still completely blackened, the step wedge having a density range from 0.05 to 3.05 with density increments of 0.15.

The resulting printing form yielded 40,000 printed sheets on a sheet-fed offset printing press.

EXAMPLE 2

A coating solution was prepared from:
- 34.5 p.b.w. of the polyurethane described in Example 1,
- 11.5 p.b.w. of a diazonium mixed condensate prepared by condensing 1 mole of 3-methoxy-diphenylamine-4-diazonium sulfate with 1 mole of 4,4'-bismethoxymethyl diphenylether in an 85% concentration phosphoric acid and isolating as mesitylene sulfonate, and
- 2.0 p.b.w. of phosphoric acid (85%) in
- 952.1 p.b.w. of ethylene glycol monomethyl ether.

The solution was applied to an electrochemically roughened and anodized aluminum sheet which had been after-treated with polyvinyl phosphonic acid. After drying, the light-sensitive layer had a layer weight of 1.0 g/m$^2$.

Processing was carried out as described in Example 1. After imagewise exposure, the offset printing plate was immersed in the developer for 1 minute and then rinsed with water. The layer was perfectly developed, i.e. even very small grid and line elements were recorded with distinct differentiation, the non-image areas did not show any scum or layer residue, and a high resolution was obtained.

For the purpose of comparison, an offset plate was prepared as described above, however, the branched polyurethane was replaced by the same quantity of a linear polyurethane comprising 4,4'-diphenylmethane-diisocyanate and an excess of a polyester diol from adipic acid and butanediol-1,4.

Development of the identically treated comparative plate was incomplete. Discernible layer residues and scumming were present in the non-image areas. A poor differentiation between image and non-image areas and a poor resolution were observed.

EXAMPLE 3

A mixture composed of 19.80 g (0.09 mole) of 2,2,4-trimethylhexamethylene-diisocyanate, 7.84 g (0.03 mole) of tris(hydroxyethyl)-isocyanurate, 14.16 g (0.07 mole) of dodecanediol-1,12 and 0.1 g of dibutyl tin diacetate in 350 g of tetrahydrofuran was refluxed for 4 hours. The resulting solution had a viscosity of 0.022 cm$^2$/s at 25° C.

A coating solution was prepared which had the following composition:
- 23.0 p.b.w. of the reaction solution obtained as described above,
- 2.3 p.b.w. of the diazonium compound specified in Example 2,
- 0.2 p.b.w. of Victoria Blue B (C.I. 44045),
- 0.1 p.b.w. of methyl orange (C.I. 13025), and
- 0.1 p.b.w. of phosphoric acid (85%) in
- 64.0 p.b.w. of ethylene glycol monomethyl ether.

The solution was applied to the layer support mentioned in Example 2. The dry-layer weight amounted to 0.9 g/m$^2$.

Processing was carried out as described in Example 1. The printing form thus obtained enabled long press runs on a sheet-fed offset printing press.

EXAMPLE 4

A mixture composed of 22.5 g (0.09 mole) of 4,4'-diphenylmethane-diisocyanate, 4.5 g (0.03 mole) of triethanolamine, 12.2 g (0.07 mole) of decanediol-1,10 and 0.1 g of 1,4-diazabicyclo-(2,2,2)-octane in 350 g of tetrahydrofuran was refluxed for 4 hours. The resulting solution had a viscosity of 0.035 cm$^2$s at 25° C.

A coating solution was prepared from:
- 20.0 p.b.w. of the above-specified reaction solution,
- 2.3 p.b.w. of the diazonium compound mentioned in Example 2,
- 0.2 p.b.w. of Rhodamine FB (C.I. 45170),
- 0.1 p.b.w. of metanil yellow (C.I. 13065), and
- 0.1 p.b.w. of phosphoric acid (85%) in
- 67.0 p.b.w. of ethylene glycol monomethyl ether.

The solution was applied to the layer support described in Example 2 in such a way that after drying a layer weight of 1.0 g/m$^2$ was obtained. Processing was carried out as mentioned in Example 1. The printing form so prepared yielded long press runs on sheet-fed offset printing presses.

EXAMPLE 5

A mixture composed of 15.98 g (0.095 mole) of hexamethylene-diisocyanate, 5.97 g (0.04 mole) of triethanolamine, 8.65 g (0.06 mole) of 1,4-bis-(hydroxymethyl)-cyclohexane, 0.1 g of di-n-butyl tin diacetate and 250 g of tetrahydrofuran was refluxed for 4 hours. The resulting solution had a viscosity of 0.0212 cm$^2$/s at 25° C.

A coating solution was prepared from:
- 34.0 p.b.w. of the above-specified reaction solution,
- 1.2 p.b.w. of the diazonium compound mentioned in Example 2,
- 0.2 p.b.w. of Fat Red 5 B (C.I. 26125),
- 0.1 p.b.w. of metanil yellow, and
- 0.1 p.b.w. of phosphoric acid (85%) in
- 64.0 p.b.w. of ethylene glycol monomethyl ether.

The solution was applied to the support described in Example 2 in such a way that after drying a layer weight of 1.0 g/m$^2$ was obtained. Processing was carried out as mentioned in Example 1. Satisfactory press runs were achieved when this printing form was used on sheet-fed offset printing presses.

EXAMPLE 6

A mixture composed of 11.52 g (0.02 mole) of a triisocyanate containing biuret groups and prepared by reacting hexamethylene-diisocyanate with water in a molar ratio of 3:1, 10.0 g (0.05 mole) of polyethylene glycol having a mean molecular weight of 200, 0.1 g of dioctyl tin dilaurate and 190 g of tetrahydrofuran was refluxed for 1 hour. The resulting solution had a viscosity of 0.0172 cm$^2$/s at 25° C.

A coating solution was prepared from:
- 34.5 p.b.w. of the above-specified reaction solution,
- 1.15 p.b.w. of the diazonium compound mentioned in Example 2,
- 0.2 p.b.w. of Victoria Pure Blue FGA (C.I. Basic Blue 81),
- 0.1 p.b.w. of metanil yellow, and
- 0.1 p.b.w. of phosphoric acid (85%) in
- 64.0 p.b.w. of ethylene glycol monomethyl ether.

The solution was applied to the support described in Example 2 in such a way that after drying a layer weight of 1.0 g/m$^2$ was obtained.

Processing was carried out similarly to the method used in Example 1. Printing forms prepared in this way resulted in long press runs of sheet-fed offset printing presses.

EXAMPLE 7

A solution composed of 26.8 g (0.2 mole) of 1,1,1,-trimethylol-propane, 70.9 g (0.6 mole) of hexane-diol-1,6, 159.3 g (0.09 mole) of tolylene-diisocyanate and 0.1 g of triethylamine in 1000 g of tetrahydrofuran was refluxed for 5 hours. The resulting solution had a viscosity of 0.0379 cm$^2$/s at 25° C.

A coating solution was prepared from:
- 17.25 p.b.w. of the above-specified reaction solution,
- 1.15 p.b.w. of the diazonium compound mentioned in Example 2,
- 0.2 p.b.w. of Rhodamine FB,
- 0.1 p.b.w. of metanil yellow, and
- 0.1 p.b.w. of phosphoric acid (85%) in
- 64.0 p.b.w. of ethylene glycol monomethyl ether.

The solution was applied to an electrochemically roughened and anodized support in such a way that after drying a layer weight of 1.0 g/m$^2$ was obtained.

Processing was carried out similarly to the method used in Example 1. The printing form obtained resulted in press runs of over 50,000 impressions on sheet-fed offset printing presses.

It will be obvious to those skilled in the art that many modifications may be made within the scope of the present invention without departing from the spirit thereof, and the invention includes all such modifications.

What is claimed is:

1. A light-sensitive composition which comprises, as the light-sensitive compound, a diazonium salt polycondensation product and, as the binding agent, a branched polyurethane resin, which is a polyaddition product of a compound having at least two isocyanate groups and a compound having at least two active hydrogen atoms capable of reacting with isocyanate groups and which contains no terminal isocyanate groups, wherein all of the terminal groups of said polyaddition product contain active hydrogen atoms and at least part of the terminal units are derived from dihydroxy compounds.

2. A light-sensitive composition as claimed in claim 1 wherein the branched polyurethane has, on an average, one branching point for every 650 to 10,000 molecular weight units.

3. A light-sensitive composition as claimed in claim 1 wherein the branched polyurethane is a polyaddition product from a diisocyanate, a diol and a triol.

4. A light-sensitive composition as claimed in claim 3 wherein the polyurethane contains, on an average about 0.1 to 9 diol units for each triol unit.

5. A light-sensitive composition as claimed in claim 1 wherein the most frequent molecular weight of the polyurethane ranges from 3,000 to 30,000.

6. A light-sensitive composition as claimed in claim 1 wherein the diazonium salt polycondensation product comprises recurring units A—N$_2$X and B connected by intermediate members derived from formaldehyde, A being a radical of an aromatic diazonium compound which is capable of condensation with formaldehyde and B being a radical of a compound which is free from diazonium groups and is capable of condensation with formaldehyde, selected from the group consisting of an aromatic amine, a phenol, a phenol ether, an aromatic thioether, an aromatic hydrocarbon, an aromatic heterocycle or an organic acid amide.

7. A light-sensitive composition as claimed in claim 1 which comprises about 30 to 90 percent by weight of polyurethane and about 10 to 70 percent by weight of diazonium salt polycondensation product, based upon the weight of the total composition.

8. A light-sensitive copying material for the preparation of printing plates, comprising a layer support and a negative-acting light-sensitive layer which contains a diazonium salt polycondensation product and a branched polyurethane resin which is a polyaddition product of a compound having at least two isocyanate groups and a compound having at least two active hydrogen atoms capable of reacting with isocyanate groups and which contains no terminal isocyanate groups, wherein all of the terminal groups of said polyaddition product contain active hydrogen atoms and at least part of the terminal units are derived from dihydroxy compounds.

9. A light-sensitive copying material as claimed in claim 8 wherein the layer support comprises anodically oxidized aluminum.

* * * * *